(12) United States Patent
Okuno

(10) Patent No.: US 9,373,750 B2
(45) Date of Patent: Jun. 21, 2016

(54) GROUP III NITRIDE SEMICONDUCTOR LIGHT-EMITTING DEVICE

(71) Applicant: TOYODA GOSEI CO., LTD., Kiyosu-shi (JP)

(72) Inventor: Koji Okuno, Kiyosu (JP)

(73) Assignee: TOYODA GOSEI CO., LTD., Kiyosu-shi, Aichi-ken (JP)

( * ) Notice: Subject to any disclaimer, the term of this patent is extended or adjusted under 35 U.S.C. 154(b) by 43 days.

(21) Appl. No.: 14/011,610

(22) Filed: Aug. 27, 2013

(65) Prior Publication Data

US 2014/0084242 A1 Mar. 27, 2014

(30) Foreign Application Priority Data

Sep. 26, 2012 (JP) ................. 2012-212599

(51) Int. Cl.
| | |
|---|---|
| H01L 29/06 | (2006.01) |
| H01L 31/00 | (2006.01) |
| H01L 33/32 | (2010.01) |
| H01L 33/06 | (2010.01) |

(52) U.S. Cl.
CPC ................ *H01L 33/32* (2013.01); *H01L 33/06* (2013.01)

(58) Field of Classification Search
CPC ............................... H01L 33/32; H01L 33/06
USPC ................ 257/13, 94, 97, E33.027, E33.028
See application file for complete search history.

(56) References Cited

U.S. PATENT DOCUMENTS

| | | | |
|---|---|---|---|
| 7,176,480 B2* | 2/2007 | Ohtsuka et al. ................. | 257/14 |
| 9,166,102 B2 | 10/2015 | Okuno et al. | |
| 2008/0308787 A1* | 12/2008 | Lee et al. ......................... | 257/13 |
| 2011/0168974 A1* | 7/2011 | Okuno ............................. | 257/13 |
| 2011/0204394 A1 | 8/2011 | Hikosaka et al. | |
| 2011/0240957 A1 | 10/2011 | Okuno et al. | |

(Continued)

FOREIGN PATENT DOCUMENTS

| | | |
|---|---|---|
| CN | 1692502 A | 11/2005 |
| CN | 102077370 A | 5/2011 |

(Continued)

OTHER PUBLICATIONS

Taiwanese Office Action dated Mar. 6, 2015 with English Translation.

(Continued)

*Primary Examiner* — Robert Huber
(74) *Attorney, Agent, or Firm* — McGinn IP Law Group PLLC

(57) ABSTRACT

The present invention provides a Group III nitride semiconductor light-emitting device which exhibits improved light emission efficiency. The light-emitting layer has a MQW structure in which a plurality of layer units are repeatedly deposited, each layer unit comprising a well layer, a capping layer, and a barrier layer sequentially deposited. The well layer is formed of InGaN, the capping layer has a structure in which a GaN layer and an AlGaN layer are deposited in this order on the well layer, and the barrier layer is formed of AlGaN. The AlGaN layer has a higher Al composition ratio than that of the barrier layer. The AlGaN layer in the former portion has a lower Al composition ratio than that of the AlGaN layer in the latter portion when the light-emitting layer is divided into a former portion at the n-cladding layer side and a latter portion at the p-cladding layer side in a thickness direction.

14 Claims, 6 Drawing Sheets

(56) References Cited

U.S. PATENT DOCUMENTS

2013/0028281 A1    1/2013    Avramescu et al.
2013/0299778 A1    11/2013   Okuno et al.

FOREIGN PATENT DOCUMENTS

| JP | H05-102604    | 4/1993  |
| JP | 09-266326 A   | 10/1997 |
| JP | 2003-031902 A | 1/2003  |
| JP | 2011-035156 A | 2/2011  |
| JP | 2011-187862 A | 9/2011  |
| JP | 2011-228646 A | 11/2011 |
| TW | 201044635 A1  | 12/2010 |
| TW | 201138148 A1  | 11/2011 |

OTHER PUBLICATIONS

Chinese Office Action and Search Report dated Oct. 27, 2015 with English Translation.
Japanese Office Action dated Oct. 20, 2015 with a partial English Translation.
Taiwanese Office Action dated Apr. 1, 2016 with English Translation.

* cited by examiner

GROUP III NITRIDE SEMICONDUCTOR LIGHT-EMITTING DEVICE

BACKGROUND OF THE INVENTION

1. Field of the Invention

The present invention relates to a Group III nitride semiconductor light-emitting device whose light-emitting layer has a MQW (Multi Quantum Well) structure.

2. Background Art

In the conventional Group III nitride semiconductor light-emitting device, a light-emitting layer has a MQW structure to improve light emission efficiency. A structure in which an InGaN well layer and an AlGaN barrier layer are repeatedly deposited has been known as the structure of such light-emitting layer. In this case, the growth temperature of the barrier layer must be higher than that of the well layer to achieve good crystallinity. However, in is evaporated from the well layer due to a temperature increase during the formation of the barrier layer, resulting in deterioration of crystallinity.

Therefore, Japanese Patent Application Laid-Open (kokai) Nos. 2011-35156 and 2011-187862 suggests a structure in which a capping layer is formed at the same growth temperature as for the well layer between the well layer and the barrier layer to prevent In evaporation due to a temperature increase during the formation of the barrier layer. Japanese Patent Application Laid-Open (kokai) No. 2011-35156 discloses that GaN is used as a capping layer, and Japanese Patent Application Laid-Open (kokai) No. 2011-187862 discloses that AlGaN is used as a capping layer. It also discloses that each capping layer has the same Al composition ratio.

In the conventional light-emitting layer, the carrier distribution is uneven and biased on the positive side. This is because the drift velocities of electrons and holes are different: electrons are easy to reach the positive side of the light-emitting layer due to high mobility, and holes are difficult to diffuse to the negative side of the light-emitting layer due to low mobility. Thus, the recombination of electrons and holes is concentrated on the positive side, resulting in a reduction of the light emission efficiency.

To solve this problem, a technique to improve light emission efficiency by reducing the unevenness of the carrier distribution in the light-emitting layer has been studied. However, it is technically difficult to completely eliminate the unevenness of the carrier distribution, and the light emission efficiency cannot be expected to improve much even if the unevenness of the carrier distribution is reduced.

SUMMARY OF THE INVENTION

In view of the foregoing, an object of the present invention is to provide a Group III nitride semiconductor light-emitting device with a light-emitting layer having a MQW structure, wherein the light emission efficiency is improved by the structure of the light-emitting layer.

The present invention is a Group III nitride semiconductor light-emitting device having a light-emitting layer formed between the n-cladding layer and the p-cladding layer, the light-emitting layer has a MQW structure, wherein the light-emitting layer has a structure in which a plurality of layer units are repeatedly deposited, each layer unit comprising a well layer and a barrier layer having a bandgap larger than that of the well layer deposited in this order, and an AlGaN layer having an Al composition ratio greater than that of the barrier layer is formed between the well layer and the barrier layer, and when the light-emitting layer is divided into two portions of a former portion at the n-cladding layer side and a latter portion at the p-cladding layer side, an average Al composition ratio of the AlGaN layers in the former portion is lower than an average Al composition ratio of the AlGaN layers in the latter portion.

As used herein, "Al composition ratio" is defined as the Al mol percent (mol %) when the mol percent of the total Group III atoms is 100 mol % in the Group III nitride semiconductor. That is, 100x (%) is the Al composition ratio in the Group III nitride semiconductor represented by the formula $Al_xGa_yIn_zN$ ($x+y+z=1$, $0 \leq x \leq 1$, $0 \leq y \leq 1$, $0 \leq z \leq 1$).

The average Al composition ratio of the AlGaN layers in the former portion means not the average Al composition ratio of some AlGaN layers in the former portion but the average Al composition ratio of all AlGaN layers in the former portion. The average Al composition ratio of the AlGaN layers in the latter portion means the same.

The light-emitting layer preferably has the following structure to further improve light emission efficiency. The average Al composition ratio of the AlGaN layers in the former portion is preferably 0.2 to 0.8 times the average Al composition ratio of the AlGaN layers in the latter portion. The light-emitting layer preferably has 3 to 12 layer units; 1 to 9 layer units in the former portion, and 2 to 11 layer units in the latter portion.

A capping layer having a larger bandgap than that of the well layer and a smaller bandgap than that of the barrier layer may be formed between the well layer and the AlGaN layer. The capping layer is a layer to be grown at the same temperature as for the well layer and to prevent the well layer from evaporating during heating for formation of the barrier layer. It is also a layer to reduce a strain between the well layer and AlGaN. Although GaN, AlGaN, and InGaN may be used as a capping layer, GaN is preferably used to further produce the above effect of the capping layer.

Each AlGaN layer may have any structure as long as the average Al composition ratio of the AlGaN layers in the former portion is lower than the average Al composition ratio of the AlGaN layers in the latter portion.

For example, each AlGaN layer may have such a structure that each AlGaN layer in the former portion has the same Al composition ratio, and each AlGaN layer in the latter portion has the same Al composition ratio which is higher than the Al composition ratio of the AlGaN layers in the former portion.

Each AlGaN layer may have such a structure that the Al composition ratio of each AlGaN layers in at least one portion of the former portion and the latter portion monotonically increases from the n-cladding layer side toward the p-cladding layer side as the number of layer units is increased. The Al composition ratio monotonically increases as the number of layer units is increased, that is, each AlGaN layer has such a structure that $A_{i+1} \geq A_i$ is always satisfied when the Al composition ratio of the ith layer unit ($i \geq 1$) counted from the n-cladding layer side is defined as $A_i$. The Al composition ratio may be increased constantly or variably. Specifically, it is a stepped increase that the Al composition ratio of each AlGaN layer in the former and latter portions monotonically increases from the n-cladding layer side toward the p-cladding layer side by one layer unit or a few layer units.

If the average Al composition ratio of the AlGaN layers in the former portion is lower than the average Al composition ratio of the AlGaN layers in the latter portion, there may be a section in the former portion or the latter portion that the Al composition ratio decreases, that is, $A_{i+1} < A_i$. However, it is preferable that $A_{i+1} \geq A_i$ is always satisfied because the effect of the present invention is further produced.

Group III nitride semiconductor having a larger bandgap than that of the well layer, e.g. AlGaN, GaN, and InGaN, may be used as a barrier layer, but particularly preferable is AlGaN.

In the conventional light-emitting layer, the carrier distribution has been biased on the p-cladding layer side. However, in the light-emitting layer of the present invention, electrons are easier to reach the p-cladding layer side of the light-emitting layer, and the carrier distribution is further biased on the p-cladding layer side. Therefore, the carriers are efficiently concentrated on the p-cladding layer side of the light-emitting layer so that electrons and holes can be efficiently recombined in the well layer at the p-cladding layer side. The drift distance of holes is shorter in the light-emitting layer, and the rate of hole capture at the non-radiative recombination center is decreased, thereby reducing the rate of non-radiative recombination. Thus, the carriers are efficiently trapped at the positive side of the light-emitting layer. Therefore, the Group III nitride semiconductor light-emitting device of the present invention exhibits improved light emission efficiency.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

A specific embodiment of the present invention will next be described with reference to the drawings. However, the present invention is not limited to the embodiment.

Embodiment 1

Figure 1:
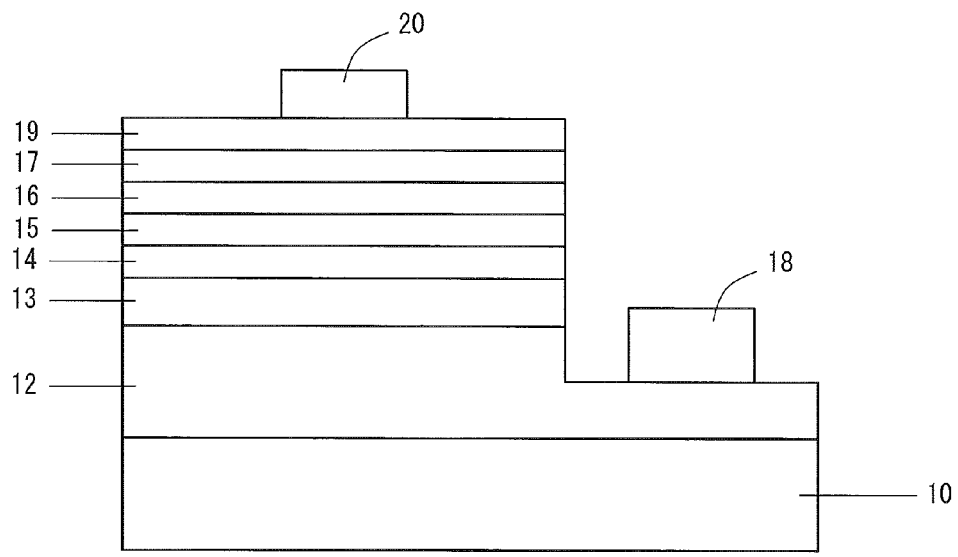
FIG. 1 shows the structure of a light-emitting device according to Embodiment 1.
Figure 2:
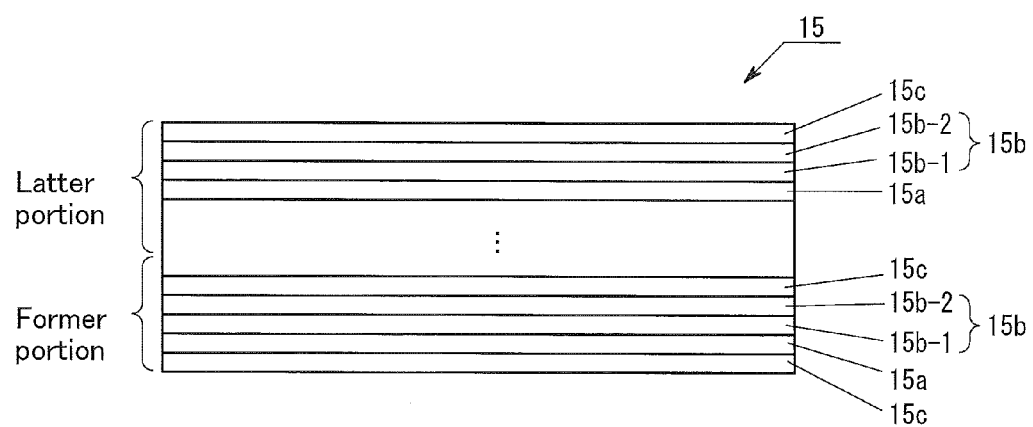
FIG. 2 shows the structure of a light-emitting layer.

FIG. 1 shows the structure of a Group III nitride semiconductor light-emitting device according to Embodiment 1.

As shown in FIG. 1, the light emitting device according to Embodiment 1 includes a sapphire substrate 10; and an n-contact layer 12, an nESD layer 13, an n-cladding layer 14, a light-emitting layer 15, a p-cladding layer 16, and a p-contact layer 17, which are sequentially deposited via an AlN buffer layer (not illustrated) on the sapphire substrate 10.

Moreover, a trench extending from the top surface of the p-contact layer 17 to the n-contact layer 12 is provided on a specific portion, and an n-electrode 18 is formed on the n-contact layer 12 exposed at the bottom of the trench. An ITO (indium tin oxide) transparent electrode 19 is formed on the p-contact layer 17, and a p-electrode 20 is formed on the transparent electrode 19. A portion except for the p-electrode 20 and the n-electrode 18 of the light-emitting device is covered with a $SiO_2$ protective film (not illustrated). This protective film is provided to prevent current leakage or short-circuit. The light-emitting device according to Embodiment 1 is of a face-up type in which a light is extracted from the surface at the p-electrode 20 side.

Next will be described in detail the structures of the light-emitting device according to Embodiment 1.

The sapphire substrate 10 has concaves and convexes (not illustrated) formed in a periodic pattern such as stripes or dots on the surface at the side where Group III nitride semiconductor is crystal grown. These concave and convexes are formed to improve light extraction performance. The growth substrate may be formed of, for example, SiC, Si, ZnO, spinel, GaN or $Ga_2O_3$ other than sapphire.

The n-contact layer 12 is formed of n-GaN having a Si concentration of $1 \times 10^{18}/cm^3$ or more. The n-contact layer 12 may comprise a plurality of layers having different Si concentrations. When some of the layers have higher Si concentration and are in-contact with the n-electrode 18, the contact resistance with the n-electrode 18 can be further reduced without deteriorating the crystallinity of the n-contact layer 12.

The nESD layer 13 has a three-layer structure of a first ESD layer, a second ESD layer, and a third ESD layer which are deposited in this order on the n-contact layer 12. The first ESD layer has pits (pit density: $1 \times 10^8/cm^2$ or less) on the surface at the light-emitting layer 15 side thereof. The first ESD layer is formed of GaN having a thickness of 200 nm to 1000 nm and a Si concentration of $1 \times 10^{16}/cm^3$ to $5 \times 10^{17}/cm^3$. The second ESD layer has pits (pit density: $2 \times 10^8/cm^2$ or more) on the surface at the light-emitting layer 15 side thereof. The second ESD layer is formed of GaN having a thickness of 50 nm to 200 nm and a carrier concentration of $5 \times 10^{17}/cm^3$ or less. The third ESD layer is formed of GaN having a characteristic value, as defined by the product of Si concentration ($/cm^3$) and thickness (nm), of $0.9 \times 10^{20}$ to $3.6 \times 10^{20}$ ($nm/cm^3$). Such nESD layer 13 can improve electrostatic breakdown voltage, light emission efficiency, and reliability, and reduce the current leakage.

The n-cladding layer 14 has a superlattice structure in which a plurality of layer units are repeatedly deposited, each layer unit having a three-layer structure of undoped InGaN, undoped GaN, and n-GaN deposited in this order.

The light-emitting layer 15 has a MQW structure in which a plurality of layer units are repeatedly deposited, each layer unit comprising a well layer 15a, a capping layer 15b, and a barrier layer 15c deposited in this order. The well layer 15a is formed of undoped InGaN. The capping layer 15b has a structure in which an undoped GaN layer 15b-1 and an undoped AlGaN layer 15b-2 are sequentially deposited on the well layer 15a. The barrier layer 15c is formed of undoped AlGaN. The well layer 15a has a thickness of 5 Å to 100 Å, and an In composition ratio of 0 mol % to 50 mol %. The GaN layer 15b-1 and the AlGaN layer 15b-2 of the capping layer 15b respectively have a thickness of 1 Å to 30 Å. The barrier layer 15c has a thickness of 5 Å to 100 Å, and an Al composition ratio of 1 mol % to 20 mol %.

In Embodiment 1, the well layer 15a, the capping layer 15b, and the barrier layer 15c of the light-emitting layer 15 are undoped, but at least one or more of these three layers may be a Si-doped n-type layer.

The capping layer 15b is a layer to protect the well layer from evaporating during heating for formation of the barrier layer 15c. The GaN layer 15b-1 of the capping layer 15b is a layer to reduce the lattice mismatch between the well layer 15a and the AlGaN layer 15b-2. This GaN layer 15b-1 may not be formed. By forming the AlGaN layer 15b-2 (in the crystal growth direction) on the well layer 15a, the piezoelectric field is relaxed, and the electric field applied to the well layer 15a is relaxed, thereby the QCSE (Quantum Confined Stark Effect) is reduced. This improves light emission efficiency.

The AlGaN layer 15b-2 has a higher Al composition ratio than that of the barrier layer 15c. When the light-emitting layer 15 is divided in the thickness direction into two portions of a former portion at the n-cladding layer 14 side and a latter portion at the p-cladding layer 16 side, the AlGaN layer 15b-2 in the former portion (hereinafter, referred to as AlGaN layer 15b-2-1) has a lower Al composition ratio than that of the AlGaN layer 15b-2 in the latter portion (hereinafter, referred to as AlGaN layer 15b-2-2). Each AlGaN layer 15b-2-1 in the former portion has the same Al composition ratio, and each AlGaN layer 15b-2-2 in the latter portion has the same Al composition ratio. The former and latter portions may have at least one layer unit of the light-emitting layer 15.

The Al composition ratio of the AlGaN layer 15b-2, the AlGaN layer 15b-2-1, and the AlGaN layer 15b-2-2, or the barrier layer 15c means the average Al composition ratio of the respective layers. The Al composition distribution in the thickness direction may be uniform or non-uniform. The Al composition ratio may continuously vary from the AlGaN layer 15b-2 to the barrier layer 15c.

As long as an average Al composition ratio of all AlGaN layers 15b-2-1 in the former portion falls within a lower range than an average Al composition ratio of all AlGaN layers 15b-2-2 in the latter portion, the Al composition ratio of each AlGaN layers 15b-2-1 may be different. Similarly, the Al composition ratio of each AlGaN layer 15b-2-2 in the latter portion may be different.

When each AlGaN layer 15b-2-1 has a different Al composition ratio, the Al composition ratio may monotonically increase as the number of layer units is increased from the n-cladding layer 14 toward the p-cladding layer 16. Further, the Al composition ratio may monotonically increase per one layer unit or a few layer units from the n-cladding layer 14 side toward the p-cladding layer 16 side. That is, the Al composition ratio may increase in a stepped form. The same is applied when each AlGaN layer 15b-2-2 has a different Al composition ratio. The Al composition ratio may be increased constantly or variably.

Figure 3A:
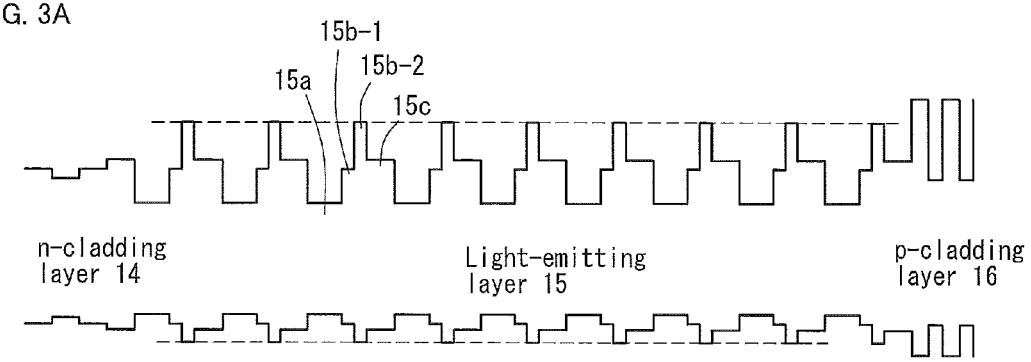
FIGS. 3A and 3B are bandgap diagrams of the light-emitting layer.
Figure 3B:
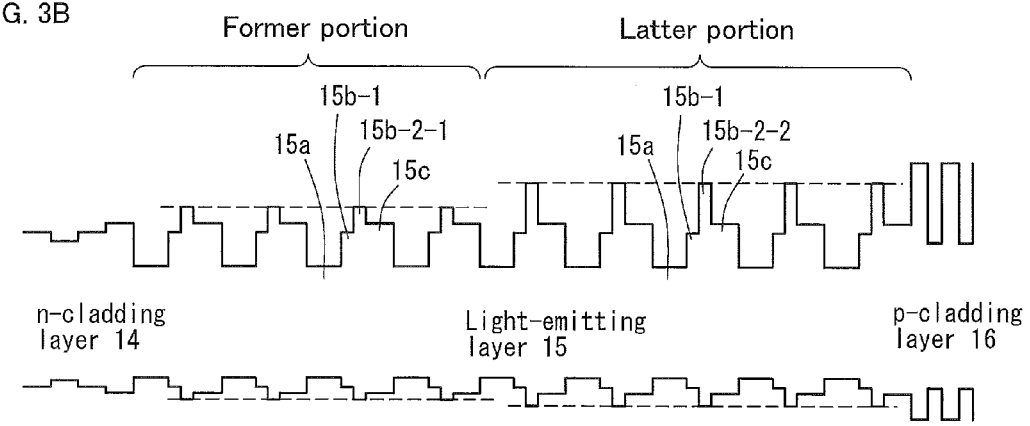

FIG. 3B shows a bandgap diagram of the light-emitting layer 15. FIG. 3B shows an example when the light-emitting layer 15 comprises nine layer units: four layer units in the former portion and five layer units in the latter portion. For comparison, FIG. 3A shows a bandgap diagram when each AlGaN layer 15b-2 has the same and constant Al composition ratio as that of the AlGaN layer 15b-2-2.

As is clear from FIG. 3B, because the AlGaN layer 15b-2-1 in the former portion has a lower Al composition ratio than that of the AlGaN layer 15b-2-2 in the latter portion, the bandgap of the AlGaN layer 15b-2-1 is smaller than that of the AlGaN layer 15b-2-2. Therefore, electrons injected from the n-cladding layer 14 side to the light-emitting layer 15 are easier to reach the p-cladding layer 16 side of the light-emitting layer 15 than when the AlGaN layer 15b-2 has a constant Al composition ratio as shown in FIG. 3A. Thus, the carrier distribution in the light-emitting layer 15 is further biased on the p-cladding layer 16 side than in the case of FIG. 3A. As a result, carriers are more concentrated on the p-cladding layer 16 side of the light-emitting layer 15 so that carriers can be efficiently trapped in the well layer 15a on the p-cladding layer 16 side. The probability of recombination between electrons and holes is increased, thereby improving light emission efficiency. On the contrary, holes are difficult to reach the n-cladding layer 14 side of the light-emitting layer 15 because the hole drift distance is shorter. The hole is easy to be trapped in the non-radiative recombination center. The larger the drift distance, the higher the probability of non-radiative recombination. Therefore, the rate of non-radiative recombination is reduced by shortening the hole drift distance. As a result, light emission efficiency is improved.

To further improve light emission efficiency, the light-emitting layer 15 preferably has the following structure. The light-emitting layer 15 preferably comprises three to twelve layer units, more preferably, six to ten layer units. Preferably, there are one to nine layer units in the former portion, and two to eleven layer units in the latter portion. More preferably, there are two to five layer units in the former portion, and two to five layer units in the latter portion. The AlGaN layer 15b-2-1 preferably has an Al composition ratio 0.2 to 0.8 times the Al composition ratio of the AlGaN layer 15b-2-2. More preferably, 0.4 to 0.6 times. Preferably, the AlGaN layer 15b-2-2 has an Al composition ratio 1.1 to 3.0 times the Al composition ratio of the barrier layer 15c. More preferably, 1.3 to 2.0 times. The barrier layer 15c has an Al composition ratio of 1 mol % to 20 mol %, more preferably, 3 mol % to 10 mol %.

The p-cladding layer 16 has a superlattice structure in which a plurality of layer units are repeatedly deposited, each layer unit comprises Mg doped AlGaN layer and Mg doped InGaN layer sequentially deposited.

The p-cladding layer 16 does not need to have a superlattice structure, and may comprise simply a plurality of layers or a single layer, e.g. Mg-doped AlGaN single layer. When it has the above superlattice structure, each layer unit may comprise two layers of AlGaN and GaN or three layers of AlGaN, GaN, and InGaN other than two layers of AlGaN and InGaN.

The p-contact layer 17 has a three-layer structure of a first p-contact layer, a second p-contact layer, and a third p-contact layer in this order on the p-cladding layer 16 side. The first p-contact layer formed of p-GaN has a thickness of 295 Å to 355 Å, a Mg concentration of $1.0 \times 10^{19}/cm^3$ to $3.0 \times 10^{19}/cm^3$. The second p contact layer formed of p-GaN has a thickness of 290 Å to 350 Å, a Mg concentration of $7.0 \times 10^{19}/cm^3$ to $2.0 \times 10^{20}/cm^3$. The third p-contact layer formed of p-GaN has a thickness of 50 Å to 110 Å, a Mg concentration of $7.0 \times 10^{19}/cm^3$ to $2.0 \times 10^{20}/cm^3$. Such a structure of the p-contact layer 17 can simultaneously reduce the contact resistance and the drive voltage.

The structure of the p-contact layer 17 is not limited to the above structure, and any conventionally known structure may be employed. For example, the p-contact layer 17 may comprise a p-GaN single layer. When it comprises a plurality of layers, the composition ratio may be changed. The first p-contact layer 17a may be formed with the Mg dopant gas supplied or by Mg doping due to memory effect without supplying the Mg dopant gas.

The transparent electrode 19 is made of ITO and formed on almost the entire surface of the p contact layer 17. The transparent electrode 19 may be formed, for example, of a transparent oxide conductive material such as ICO (cerium-doped indium oxide), IZO (zinc-doped indium oxide), ZnO, $TiO_2$, $NbTiO_2$, and $TaTiO_2$ other than ITO, a metal thin film such as Co/Au, Au or graphene.

The n-electrode 18 and the p-electrode 20 may have a structure including a pad to which a wire is bonded, and a wiring pattern extending (e.g. in a grid-like pattern, a comb teeth pattern, or a radial pattern) on each surface of the n-contact layer 12 and the transparent electrode 19, which is connected to the pad. Such a structure can improve the current diffusion, thereby obtaining uniform light emission.

Since the light-emitting layer 15 has the above structure in the light-emitting device according to Embodiment 1, the carrier distribution in the light-emitting layer 15 is further biased on the p-cladding layer 16 side than in the conventional structure, resulting in improvement of light emission efficiency.

Next will be described processes for producing the light-emitting device according to Embodiment 1 with reference to figures. The Group III nitride semiconductor is formed by atmospheric pressure MOCVD. The raw material gases employed in MOCVD are as follows: ammonia gas ($NH_3$) as a nitrogen source; trimethylgallium ($Ga(CH_3)_3$) as a Ga source; trimethylindium ($In(CH_3)_3$) as an In source; trimethylaluminum ($Al(CH_3)_3$) as an Al source; silane ($SiH_4$) as a Si dopant gas; cyclopentadienylmagnesium ($Mg(C_5H_5)_2$) as a Mg dopant gas; and hydrogen ($H_2$) and nitrogen ($N_2$) as a carrier gas.

Figure 4A:
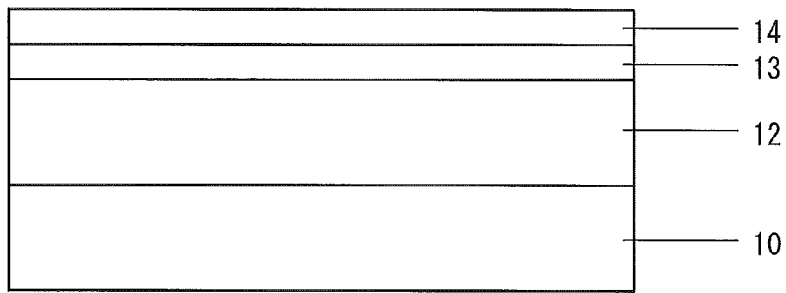
FIGS. 4A to 4C are sketches showing processes for producing the light-emitting device according to Embodiment 1.

Firstly, a sapphire substrate 10 having concaves and convexes thereon is prepared, and heated in a hydrogen atmosphere for cleaning of the surface. Subsequently, on the sapphire substrate 10, by atmospheric pressure MOCVD, an AlN buffer layer (not illustrated), an n-contact layer 12, an nESD layer 13, and an n-cladding layer 14 are sequentially deposited (FIG. 4A).

Figure 4B:
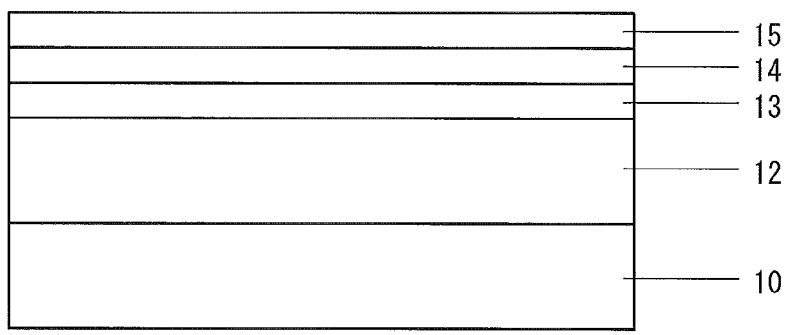

Next, a light-emitting layer 15 is formed on the n-cladding layer 14 by atmospheric pressure MOCVD (FIG. 4B). The processes for producing the light-emitting layer 15 will be described in details with reference to FIGS. 5A to 5D.

Figure 5A:
FIGS. 5A to 5D are sketches showing processes for forming the light-emitting layer 15.

Firstly, an AlGaN barrier layer 15c is formed on the n-cladding layer 14 at a temperature of 770° C. to 1000° C. (higher than the temperature for forming a well layer 15a thereafter) by atmospheric pressure MOCVD (FIG. 5A).

Figure 5B:
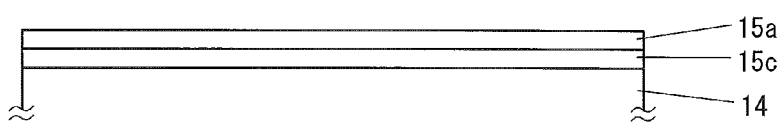

Secondly, after lowering the temperature, an InGaN well layer 15a is formed at a temperature of 600° C. to 850° C. by atmospheric pressure MOCVD (FIG. 5B).

Figure 5C:
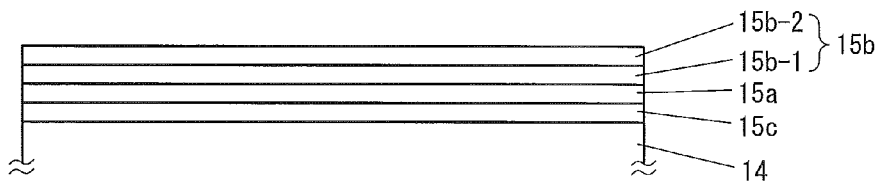

Thirdly, a capping layer 15b is formed by sequentially depositing a GaN layer 15b-1 and an AlGaN layer 15b-2 at the same temperature by atmospheric pressure MOCVD (FIG. 5C). When the capping layer 15b is formed, the GaN layer 15b-1 of the capping layer 15b may be evaporated to become thin or be lost as long as the well layer 15a is not evaporated.

Figure 5D:
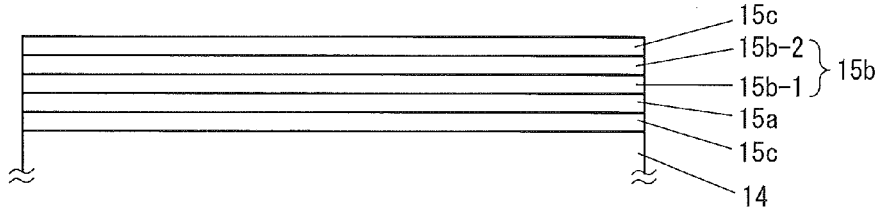

Then, after increasing the temperature to 770° C. to 1000° C., a barrier layer 15c is formed on the capping layer 15b (FIG. 5D). At this time, the presence of the capping layer 15b suppresses the well layer 15a from evaporating during the temperature increase.

Subsequently, a former portion of the light-emitting layer 15 is formed by sequentially and repeatedly depositing a well layer 15a, a capping layer 15b, and a barrier layer 15c, and forming a plurality of layer units, each layer unit comprising these three layers.

Under the same conditions except that the Al composition ratio of the AlGaN layer 15b-2 is higher by increasing the supply amount of Al source gas when forming the AlGaN layer 15b-2 of the capping layer 15b, a latter portion of the light-emitting layer 15 is formed by further repeatedly depositing the well layer 15a, the capping layer 15b, and the barrier layer 15c, and forming a plurality of layer units.

Through the above processes, the light-emitting layer 15 is formed.

Figure 4C:
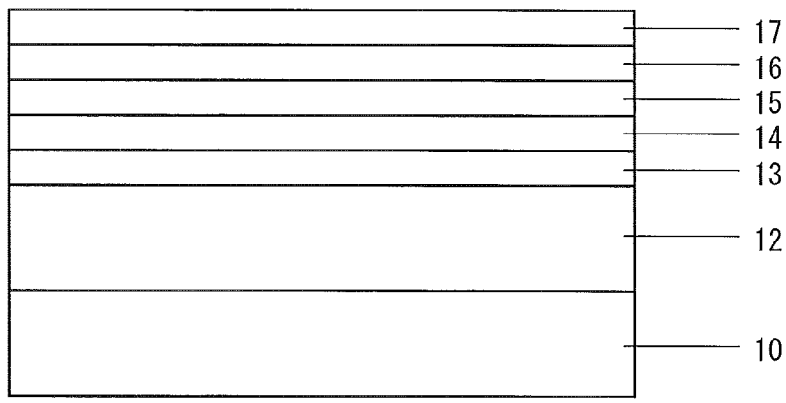

Next, a p-cladding layer 16 and a p-contact layer 17 are sequentially deposited on the light-emitting layer 15 by atmospheric pressure MOCVD (FIG. 4C).

Subsequently, a trench having a depth extending from the top surface of the p-contact layer 17 to the n-contact layer 12 is formed by dry etching a specific portion. The transparent electrode 19 made of ITO is formed on almost the entire surface of the p contact layer 17, a p-electrode 20 is formed on the transparent electrode 19, and an n-electrode 18 is formed on the surface of the n-contact layer 12 exposed at the bottom of the trench. Through the above, the Group III nitride semiconductor light-emitting device according to Embodiment 1 as shown in FIG. 1 is produced.

Figure 6:
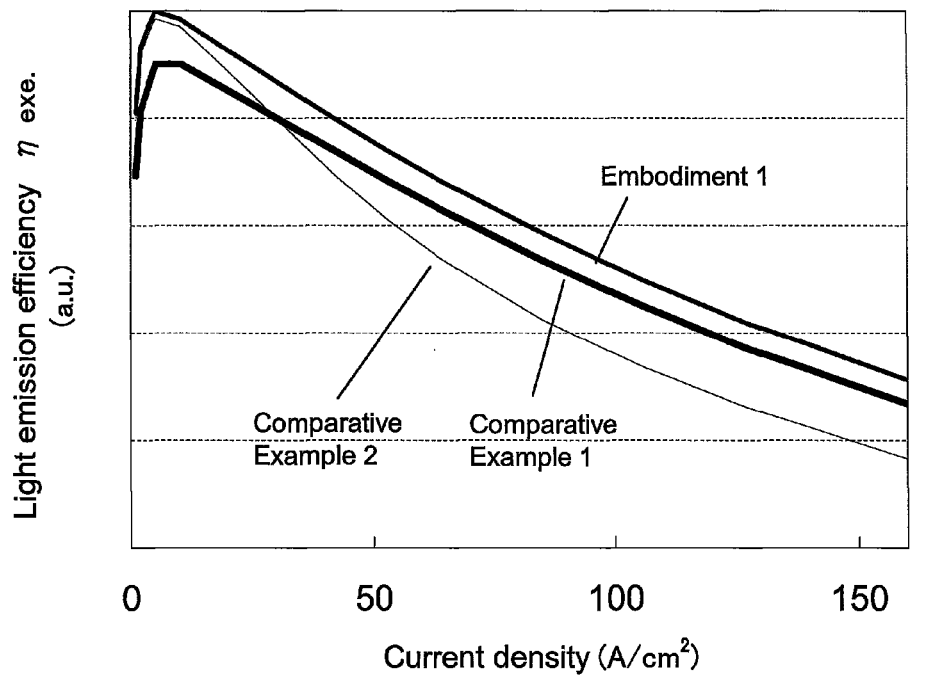
FIG. 6 is a graph showing the relationship between light emission efficiency and current density.

FIG. 6 is a graph showing the relationship between the light emission efficiency and the current density of the light-emitting device according to Embodiment 1. The light-emitting layer 15 comprises nine layer units: four layer units in the former portion, and five layer units in the latter portion. The AlGaN layer 15b-2-1 in the former portion has an Al composition ratio of 6 mol %, and the AlGaN layer 15b-2-2 in the latter portion has an Al composition ratio of 12 mol %. The relationship between the light emission efficiency and the current density of the light-emitting device according to Comparative Examples 1 and 2 are also shown in the graph of FIG. 6. The light-emitting device according to Comparative Example 1 has the same structure as the light-emitting device according to Embodiment 1 except that the AlGaN layers of all the capping layers have an Al composition ratio of 12 mol %. The light-emitting device according to Comparative Example 2 has the same structure as the light-emitting device according to Embodiment 1 except that the light-emitting layer is divided into two portions of a former portion and a latter portion, the former portion has seven layer units and the latter portion has two layer units, and the AlGaN layers of the capping layers in the former portion have an Al composition ratio of 12 mol %, and the AlGaN layers of the capping layers in the latter portion have an Al composition ratio of 6 mol %.

As is clear from FIG. 6, the light-emitting device according to Comparative Example 1 has a characteristic that the light emission efficiency is gradually reduced as the current density increases. The light-emitting device according to Embodiment 1 has the same characteristic, but the light emission efficiency is higher than that of the light-emitting device according to Comparative Example 1 at any current density. In a low current density range of 10 A/cm² or less, the light-emitting device according to Embodiment 1 and the light-emitting device according to Comparative Example 2 have the same light emission efficiency. However, in a high current density range of 10 A/cm² or more, the light-emitting device according to Embodiment 1 has higher light emission efficiency than that of the light-emitting device according to Comparative Example 2. The light emission efficiency of the light-emitting device according to Comparative Example 2 is more rapidly reduced with an increase of current density than that of the light-emitting device according to Embodiment 1 or Comparative Example 1. The higher the current density, the greater the difference in light emission efficiency between the light-emitting device according to Embodiment 1 and the light-emitting device according to Comparative Example 2. The light-emitting device according to Comparative Example 2 has the opposite structure to the light-emitting layer 15 of Embodiment 1, which opposite structure reduces the unevenness of the carrier distribution. Thus the light emission efficiency of Comparative Example 2 is considered to improve compared to Comparative Example 1. However, the light emission efficiency of Comparative Example 2 is higher than that of Comparative Example 1 only in the low current density range. On the contrary, the light emission efficiency of Comparative Example 1 is higher than that of Comparative Example 2 in a current density range of 30 A/cm² or more.

It turns out that the light-emitting device according to Embodiment 1 has a higher light emission efficiency than the light-emitting device according to Comparative Examples 1 and 2. It is considered that the light-emitting layer 15 of the light-emitting device according to Embodiment 1 has a structure in which the carrier distribution is further biased on the p-cladding layer side than the light-emitting layer of the light-emitting device according to Comparative Example 1.

Figure 7:
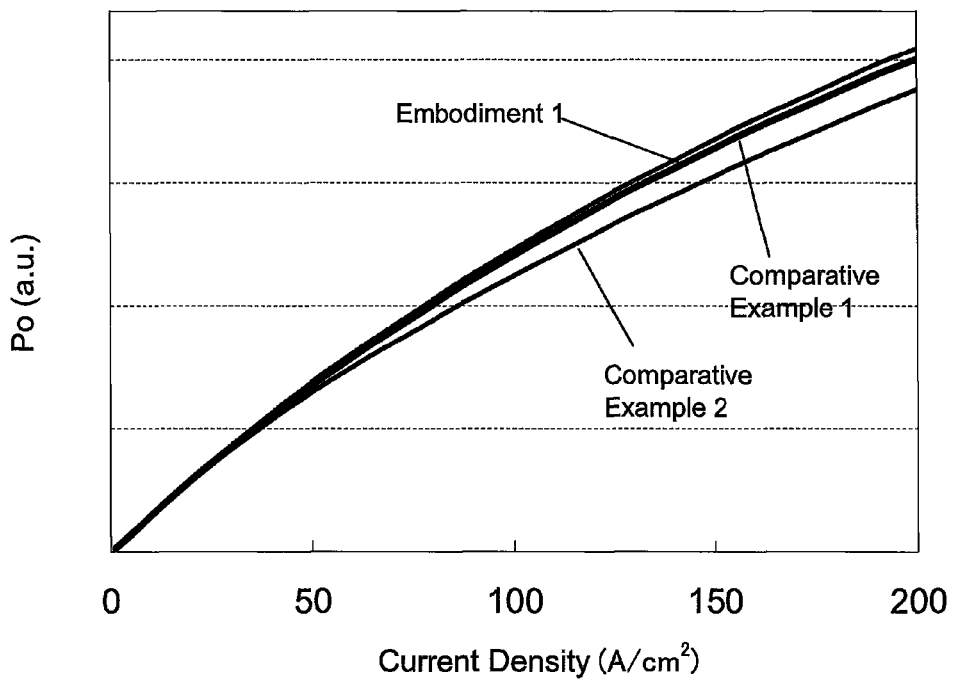
FIG. 7 is a graph showing the relationship between light output and current density.

FIG. 7 is a graph showing the relationship between the light output and the current density of the light-emitting devices according to Embodiment 1, Comparative Examples 1, and 2. As is clear from FIG. 7, when the current density is small, the light-emitting device according to Embodiment 1 and the light-emitting devices according to Comparative Examples 1 and 2 have the same light output. However, the larger the current density, the larger the light output of the light-emitting device according to Embodiment 1 than the light-emitting device according to Comparative Example 1. The larger the current density, the smaller the light output of the light-emitting device according to Comparative Example 2 than the light-emitting device according to Comparative Example 1.

Figure 8:
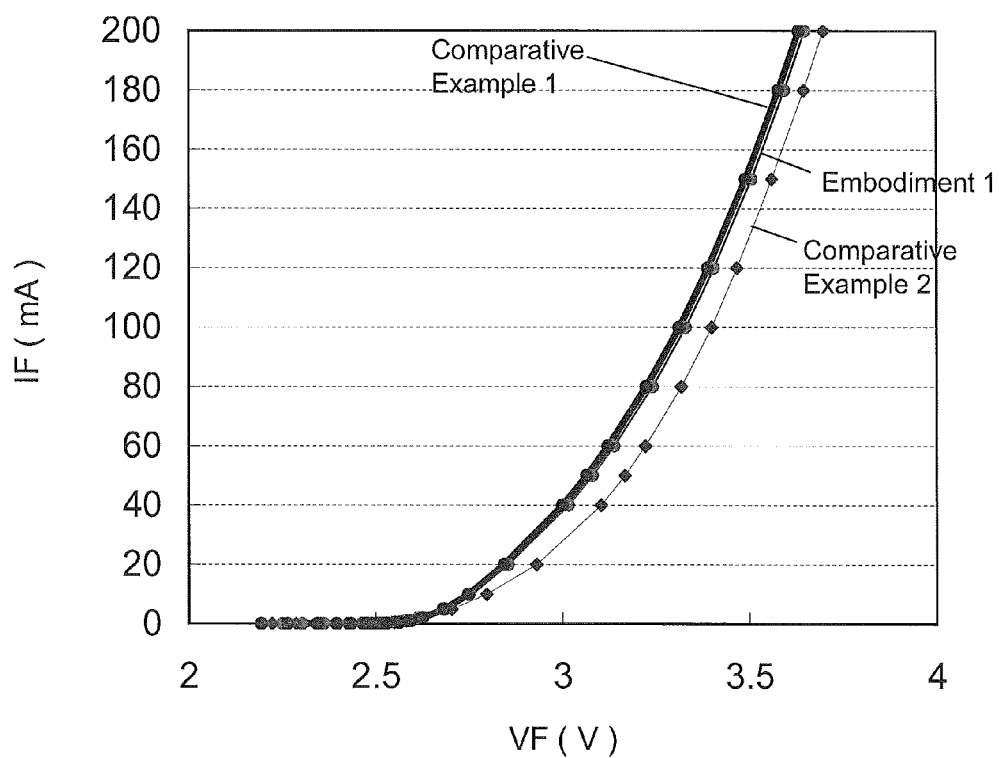
FIG. 8 is a graph showing the VF-IF characteristic.

FIG. 8 is a graph showing the VF-IF characteristic of the light-emitting devices according to Embodiment 1, Comparative Examples 1 and 2. As shown in FIG. 8, the light-emitting device according to Embodiment 1 and the light-emitting device according to Comparative Example 1 has little difference in VF-IF characteristic. Therefore, the light-emitting device according to Embodiment 1 exhibits improved light emission efficiency without affecting the driving voltage. On the other hand, the driving voltage is increased in the light-emitting device according to Comparative Example 2 compared to the light-emitting device according to Comparative Example 1.

In Embodiment, focusing on the point that the AlGaN layer 15b-2 is formed at the same temperature as for the well layer 15a, the AlGaN layer 15b-2 is interpreted as a part of the capping layer 15b. On the contrary, focusing on the point that the AlGaN layer 15b-2 has a larger bandgap than that of the well layer 15a, which contributes to the confinement of the carriers in the well layer 15a, the AlGaN layer 15b-2 can also be interpreted as a part of the barrier layer 15c. The AlGaN layer 15b-2 can also be interpreted as a separate layer from the capping layer or the barrier layer. That is, the present invention also includes the Group III nitride semiconductor light-emitting device of which the AlGaN layer 15b-2 is a part of the capping layer or the barrier layer, or a separate layer from those layers.

In Embodiment, the well layer 15a is formed of InGaN, and the barrier layer 15c is formed of AlGaN. However, as long as the barrier layer 15c has a larger bandgap than that of the well layer 15a, the well layer 15a and the barrier layer 16c may be formed of Group III nitride semiconductor having any composition ratio, e.g. GaN or InGaN.

The GaN layer 15b-1 in Embodiment is not necessarily formed of GaN, as long as it is formed of Group III nitride semiconductor having a larger bandgap than that of the well layer, and having a smaller bandgap than that of the barrier layer. AlGaN or InGaN may be used instead of GaN.

The Group III nitride semiconductor light-emitting device according to Embodiment 1 is of a face-up type. However, the present invention is not limited to this, and may also be applied to a flip-chip type or a vertical type Group III nitride semiconductor light-emitting device. A vertical type has a structure to establish an electrical conduction in a direction perpendicular to the main surface of the substrate, which can be achieved e.g. by removing the growth substrate using a laser lift-off technique or by employing a self-standing substrate.

Moreover, in Embodiment, the light-emitting layer 15 is divided into two portions of a former portion and a latter portion. This is the idea including the cases where the light-emitting layer 15 is divided into three or more portions. For example, even if the light-emitting layer 15 is divided into three portions of former, intermediate, and latter portions depending on the Al composition ratio of the AlGaN layers 15b-1, as long as the former portion and the intermediate portion are considered as a former portion, an average Al composition ratio in the former portion is lower than an average Al composition ratio in the latter portion in the present invention.

The Group III nitride semiconductor light-emitting device of the present invention can be employed as a light source of, for example, an illumination apparatus, a display apparatus, or an optical communication device.

What is claimed is:

1. A Group III nitride semiconductor light-emitting device including a light-emitting layer between an n-cladding layer and a p-cladding layer, the light-emitting layer includes a Multi Quantum Well (MQW) structure,
   wherein the light-emitting layer includes a structure in which a plurality of layer units are continuously and repeatedly deposited, each layer unit consisting of a well layer, a barrier layer having a bandgap larger than a bandgap of the well layer, and an AlGaN layer having an Al composition ratio greater than an Al composition ratio of the barrier layer and formed between the well layer and the barrier layer, the well layer, the AlGaN layer, and the barrier layer being directly in contact with each other,
   wherein the light-emitting layer comprises two portions of a former portion at an n-cladding layer side and a latter portion at a p-cladding layer side continued to the former portion, the former portion comprising a plurality of repeated first layer units and the latter portion comprising a plurality of repeated second layer units, in which an average Al composition ratio of the AlGaN layers in the former portion is lower than an average Al composition ratio of the AlGaN layers in the latter portion,
   wherein a disposition order of the well layer, the AlGaN layer, and the barrier layer in said each layer unit is the same between the former portion and the latter portion,
   wherein the average Al composition ratio of the AlGaN layers in the former portion is 0.2 to 0.8 times the average Al composition ratio of the AlGaN layer in the latter portion, and
   wherein each of the AlGaN layers in the former portion has a same Al composition ratio, and each of the AlGaN layers in the latter portion has a same Al composition ratio.

2. The Group III nitride semiconductor light-emitting device according to claim 1, wherein the light-emitting layer includes three to twelve layer units.

3. The Group III nitride semiconductor light-emitting device according to claim 1, wherein the light-emitting layer includes one to nine layer units in the former portion.

4. The Group III nitride semiconductor light-emitting device according to claim 3, wherein the light-emitting layer includes two to eleven layer units in the latter portion.

5. A Group III nitride semiconductor light-emitting device including a light-emitting layer between an n-cladding layer and a p-cladding layer, the light-emitting layer includes a Multi Quantum Well (MQW) structure, wherein the light-emitting layer includes a structure in which a plurality of layer units are continuously and repeatedly deposited, each layer unit comprising a well layer, a barrier layer having a bandgap larger than a bandgap of the well layer, and an AlGaN layer having an Al composition ratio greater than an Al composition ratio of the barrier layer and formed between the well layer and the barrier layer, wherein the light-emitting layer comprises two portions of a former portion at an n-cladding layer side and a latter portion at a p-cladding layer side continued to the former portion, the former portion comprising a plurality of repeated first layer units and the latter portion comprising a plurality of repeated second layer units, in which an average Al composition ratio of the AlGaN layers in the former portion is lower than an average Al composition ratio of the AlGaN layers in the latter portion, wherein a disposition order of the well layer, the AlGaN layer and the barrier layer in the each layer unit is same between the former portion and the latter portion, and wherein a capping layer having a bandgap which is larger than that of the well layer and smaller than that of the barrier layer is formed between the well layer and the AlGaN layer.

6. The Group III nitride semiconductor light-emitting device according to claim 5, wherein the average Al composition ratio of the AlGaN layers in the former portion is 0.2 to 0.8 times the average Al composition ratio of the AlGaN layer in the latter portion.

7. The Group III nitride semiconductor light-emitting device according to claim 5, wherein the light-emitting layer includes one to nine layer units in the former portion, and the light-emitting layer includes two to eleven layer units in the latter portion.

8. The Group III nitride semiconductor light-emitting device according to claim 6, wherein the light-emitting layer includes one to nine layer units in the former portion, and the light-emitting layer includes two to eleven layer units in the latter portion.

9. A Group III nitride semiconductor light-emitting device, including a light-emitting layer between an n-cladding layer and a p-cladding layer, the light-emitting layer includes a Multi Quantum Well (MQW) structure, wherein the light-emitting layer includes a structure in which a plurality of layer units are continuously and repeatedly deposited, each layer unit consisting of a well layer, a barrier layer having a bandgap larger than a bandgap of the well layer, and an AlGaN layer having an Al composition ratio greater than an Al composition ratio of the barrier layer and formed between the well layer and the barrier layer, the well layer, the AlGaN layer, and the barrier layer being directly in contact with each other, wherein the light-emitting layer comprises two portions of a former portion at an n-cladding layer side and a latter portion at a p-cladding layer side continued to the former portion, the former portion comprising a plurality of repeated first layer units and the latter portion comprising a plurality of repeated second layer units, in which an average Al composition ratio of the AlGaN layers in the former portion is lower than an average Al composition ratio of the AlGaN layers in the latter portion, wherein a disposition order of the well layer, the AlGaN layer, and the barrier layer in the layer unit is same between the former portion and the latter portion, wherein the light-emitting layer includes one to nine layer units in the former portion, and the light-emitting layer includes two to eleven layer units in the latter portion, and wherein each of the AlGaN layers in the former portion has a same Al composition ratio, and each of the AlGaN layers in the latter portion has a same Al composition ratio.

10. The Group III nitride semiconductor light-emitting device according to claim 5, wherein each of the AlGaN layers in the former portion has a same Al composition ratio, and each of the AlGaN layers in the latter portion has a same Al composition ratio.

11. The Group III nitride semiconductor light-emitting device according to claim 5, wherein the Al composition ratio of the AlGaN layers in at least one portion of the former portion and the latter portion monotonically increases from the n-cladding layer side toward the p-cladding layer side as a number of layer units is increased.

12. The Group III nitride semiconductor light-emitting device according to claim 1, wherein the Al composition ratio of the AlGaN layers in the former portion and the latter portion monotonically increases per one layer unit or a few layer units from the n-cladding layer side toward the p-cladding layer side.

13. The Group III nitride semiconductor light-emitting device according to claim 8, wherein the barrier layer comprises AlGaN.

14. The Group III nitride semiconductor light-emitting device according to claim 13, wherein the capping layer comprises GaN.

\* \* \* \* \*